(12) United States Patent
Patterson et al.

(10) Patent No.: US 6,476,426 B1
(45) Date of Patent: Nov. 5, 2002

(54) ELECTRONIC COMPONENT AND METHOD FOR IMPROVING PIXEL CHARGE TRANSFER IN THE ELECTRONIC COMPONENT

(75) Inventors: Jennifer J. Patterson, Mesa; Mark S. Swenson, Higley; Clifford I. Drowley, Scottsdale, all of AZ (US)

(73) Assignee: Motorola, Inc., Schuamburg, IL (US)

( * ) Notice: Subject to any disclaimer, the term of this patent is extended or adjusted under 35 U.S.C. 154(b) by 0 days.

(21) Appl. No.: 09/347,552

(22) Filed: Jul. 6, 1999

(51) Int. Cl.[7] .................. H01L 27/148; H01L 21/00
(52) U.S. Cl. .................. 257/225; 257/229; 257/233; 257/240; 438/75
(58) Field of Search .................. 257/225, 228, 257/229, 221, 227, 231, 233, 240, 241; 438/75, 78, 60

(56) References Cited

U.S. PATENT DOCUMENTS

| | | | |
|---|---|---|---|
| 4,484,210 A | 11/1984 | Shiraki et al. | 257/233 |
| 5,049,960 A | 9/1991 | Miwada | 257/240 |
| 5,306,906 A | 4/1994 | Aoki et al. | 250/208.1 |
| 5,365,093 A | 11/1994 | Kuno | 257/233 |
| 5,488,239 A | 1/1996 | Jung | 257/231 |
| 5,587,576 A | * 12/1996 | Maki | 235/462.41 |
| 5,589,698 A | 12/1996 | Nakashiba | 257/231 |
| 5,625,210 A | 4/1997 | Lee et al. | 257/292 |
| 5,675,158 A | 10/1997 | Lee et al. | 257/233 |
| 5,903,021 A | 5/1999 | Lee et al. | 257/292 |

OTHER PUBLICATIONS

"A 0.6 um CMOS Pinned Photodiode Color Imager Technology"—R.M. Guidash et al.—Submitted to IEDM'97, 3 Pages.

* cited by examiner

Primary Examiner—Eddie Lee
Assistant Examiner—José R. Díaz
(74) Attorney, Agent, or Firm—James L. Clingan, Jr.

(57) ABSTRACT

An electronic component having an image sensing device (41, 71, 86, 132, 182, 212) and a method for improving pixel charge transfer in the image sensing device (41, 71, 86, 132, 182, 212). The image sensing device (41, 71, 86, 132, 182, 212) has a transfer gate (42, 82) between a source region (43, 83) and an image sensing region. The image sensing region is formed to have a wider device width proximate to the transfer gate (42, 82) than at a point distal from the transfer gate (42, 82).

4 Claims, 7 Drawing Sheets

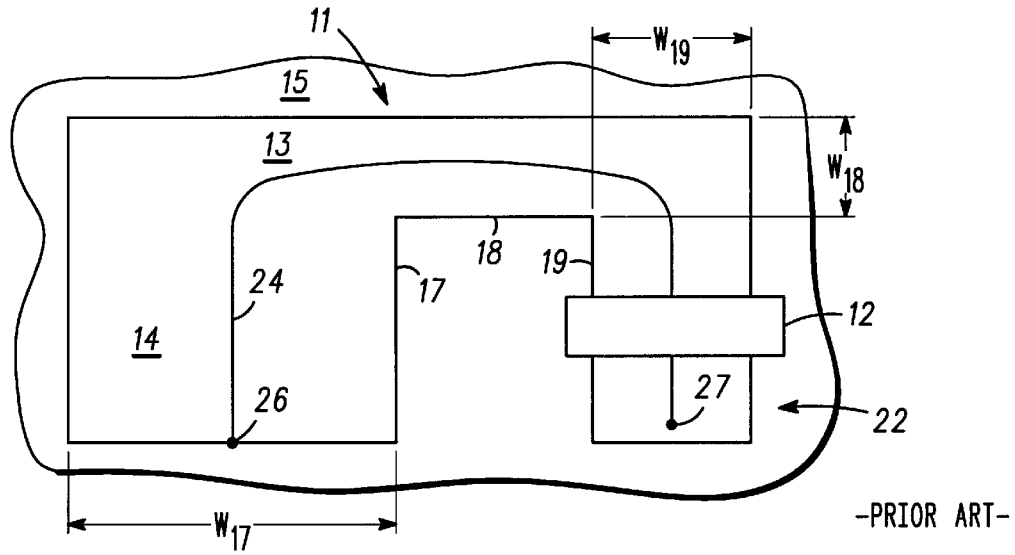
FIG. 1 —PRIOR ART—
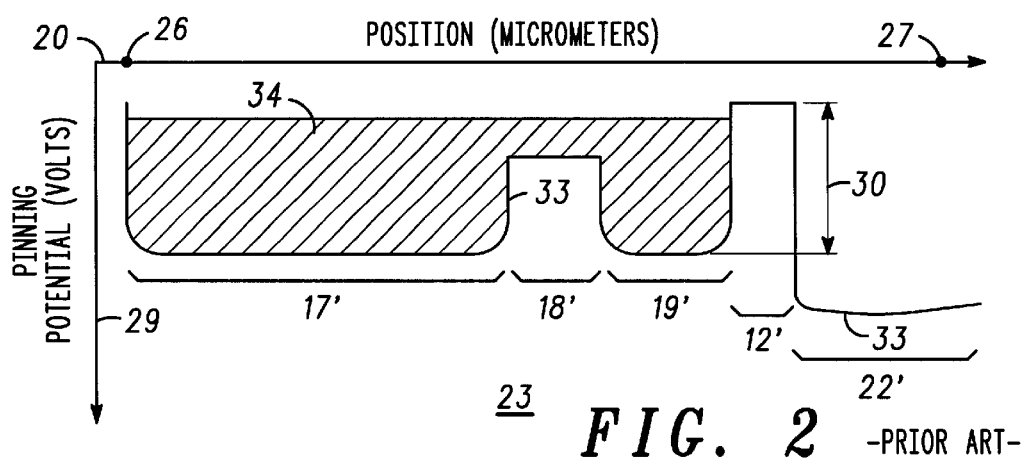
FIG. 2 —PRIOR ART—
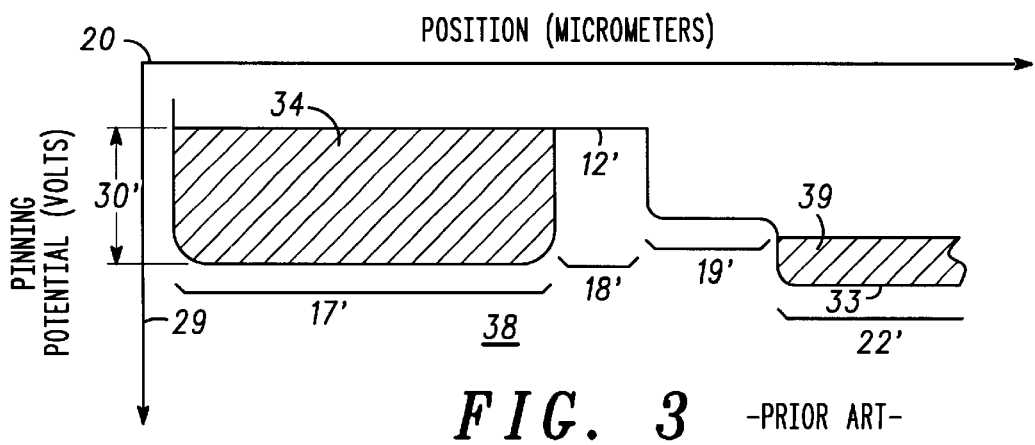
FIG. 3 —PRIOR ART—

ELECTRONIC COMPONENT AND METHOD FOR IMPROVING PIXEL CHARGE TRANSFER IN THE ELECTRONIC COMPONENT

BACKGROUND OF THE INVENTION

The present invention relates, in general, to electronic components and, more particularly, to electronic components capable of sensing optical signals.

Image sensor applications such as cameras, scanners, biometric systems, etc. often use solid state electronic components to detect images. Typically the electronic components include pixel cells comprising image sensing devices integrated with signal processing and control circuitry on a single semiconductor chip. Integration of the image sensing devices with the signal processing and control circuitry offers the advantage of lower cost and higher output because conventional processing technologies can be used for their manufacture.

In operation, photons from an optical signal strike the image sensing device, thereby generating electron-hole pairs. A voltage is applied to the image sensing device to remove one of the charge species, while the other charge species is stored in an image sensing area. The charge species stored in the image sensing area are then removed. The signal processing and control circuitry measures the amount of electrical charge removed from the image sensing area and converts this measurement into a value indicating the intensity of the optical signal sensed by the image sensing device. However, due to the configuration of the image sensing area, not all of the charge species stored in the image sensing area can be removed. The charge species that remains lowers the sensitivity of the of the pixel cell and results in image lag.

Accordingly, it would be advantageous to have a structure and method for increasing the amount of charge that is removed from an image sensing device. It would be of further advantage for the structure to be manufacturable using standard processing techniques.

BRIEF DESCRIPTION OF THE DRAWINGS

FIG. 1 is a top view of a portion of a prior art pixel cell having an image sensing area, a transfer gate, and a source node;

FIG. 2 is an electrostatic diagram for the pixel cell of FIG. 1 when the transfer gate is not enabled;

FIG. 3 is an electrostatic diagram for the pixel cell of FIG. 1 when the transfer gate is enabled;

For simplicity and clarity of illustration, elements in the drawings are not necessarily drawn to scale, and the same reference numerals in different figures denote the same elements.

DETAILED DESCRIPTION OF THE DRAWINGS

Figure 4:
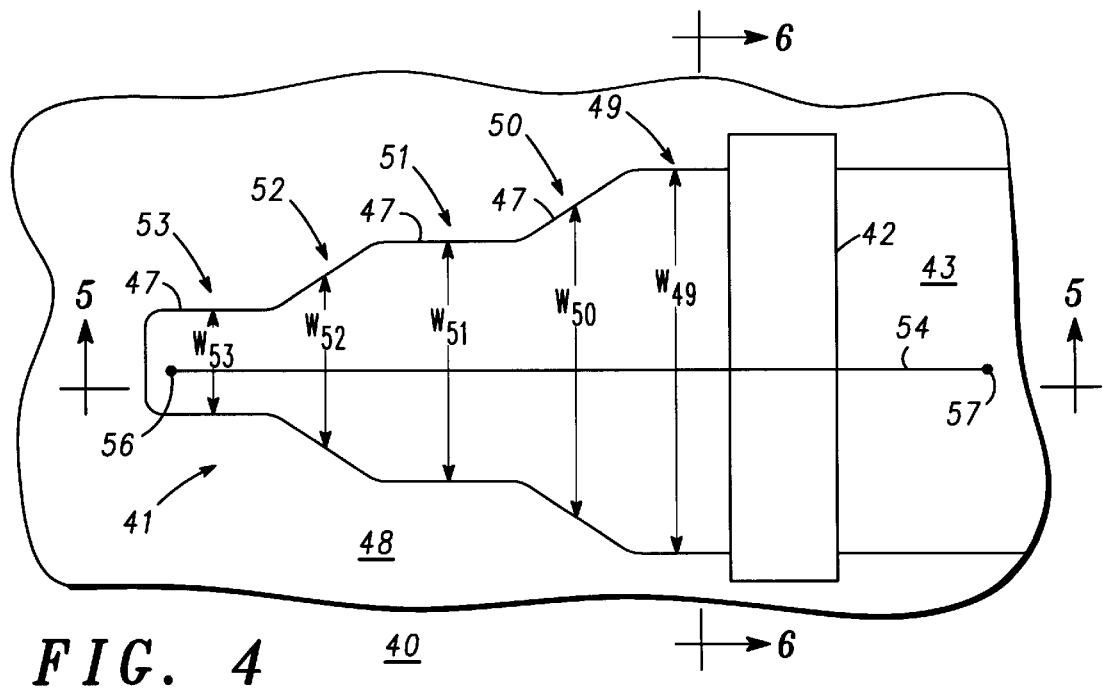
FIG. 4 is a top view of a portion of a pixel cell in accordance with a first embodiment of the present invention.

Generally, the present invention provides an electronic component comprising a pixel cell having an image sensing device such as, for example, a photosensor and a method for improving charge transfer efficiency in the pixel cell. Typically, a 4-transistor pixel cell includes an image sensing device, a charge transfer device, a source node, a reset device, a buffering device, and a row select device. The image sensing device has an image sensing area for collecting charge species in response to light impinging on the image sensing device. The charge transfer device is then activated to transfer the charges stored in the image sensing area to the source node. The number of charges transferred is quantified to determine the intensity of the light being received by the pixel cell. The inventors have discovered a flaw in the configuration of the image sensing area that creates an electrostatic barrier and prevents the removal of all the charge stored in the image sensing area. One solution to this problem is to increase the voltage for activating the transfer gate. However, this solution increases the power consumption of the image sensing device and still does not remove all the charge stored in the image sensing area. Another solution is to form additional doped regions under the transfer gate. A drawback to this solution is that it involves additional processing steps that increase the manufacturing cost and the cycle time for manufacturing the pixel cells.

FIG. 1 is a top view of a portion 10 of a prior art pixel cell and is intended to illustrate the problem that is common to prior art pixel cells. More particularly, FIG. 1 illustrates a top view of the portion of the pixel cell having an image sensing device 11, a transfer gate 12, and a source node 22. Source node 22 is also referred to as a floating diffusion node or region. Image sensing device 11 is formed in a semiconductor substrate 13, has an active sensing area or region 14, which is surrounded by a field oxide 15. Active sensing region 14 is a "U" shaped region that is comprised of a primary region 17, a neck region 18, and a gate region 19. Active sensing region 14 is also referred to as an image sensing region. Region 17 is referred to as a primary region because it is a large sensor area over which charge is collected. Region 18 is referred to as a neck region because it connects primary region 17 to gate region 19 and it is narrower than primary region 17 and gate region 19. Region 19 is referred to as a gate region because of its proximity to transfer gate 12.

Primary region 17 is a square shaped region having four sides and a width $W_{17}$. Neck region 18 is a rectangularly shaped region having a width $W_{18}$ and a first end that extends from primary region 17. Width $W_{18}$ of neck region 18 is less than width $W_{17}$ of primary region 17. A second end of neck region 18 is connected to and continuous with gate region 19. Gate region 19 is adjacent to a first side of transfer gate 12 and has a width $W_{19}$. It should be understood that width $W_{18}$ of neck region 18 is less than widths $W_{17}$ and $W_{19}$ of primary region 17 and gate 19, respectively. Source node 22 is adjacent to a second side of transfer gate 12.

Reference line 24 merely illustrates a path between reference points 26 and 27 along which charge travels and will be further described with reference to FIG. 2.

The purpose of image sensing device 11 is to capture the optical signal generated by an image when image sensing device 11 is in an image sensing mode. In particular, photons from the optical signal strike active sensing region 14 and generate electron-hole pairs that create a stored charge within image sensing region 14. The amount of charge stored in image sensing region 14 is proportional to the intensity of the light signal detected by image sensing device 11.

After an image is captured, the amount of charge stored in image sensing region 14 is measured so the intensity of the optical signal can be determined. The stored charge is extracted by applying a voltage to source node 22 and enabling transfer gate 12. Although this procedure extracts much of the charge stored in image sensing region 14, neck region 18 creates a potential barrier that prohibits all of the charge stored in image sensing region 14 from being extracted or removed from this region.

The effect of neck region 18 is demonstrated in electrostatic diagram 23 shown in FIG. 2, which is described in conjunction with FIG. 1. Electrostatic diagram 23 is a graph that indicates the amount of charge stored in image sensing region 14 when transfer gate 12 is not enabled, i.e., off. Electrostatic diagram 23 has an "x-axis" 20 that represents a position in micrometers across image sensing region 14, transfer gate 12, and source node 22 (see FIG. 1) along reference line 24. Reference line 24 is included to aid in the description of the electrostatic diagram 23, wherein reference line 24 corresponds to positions along the "x-axis" beginning at a point 26 far away from, i.e., distal from, transfer gate 12. Reference line 24 then traverses image sensing region 14, transfer gate 12, and terminates at a point 27 near source node 22. Reference points 26 and 27 are illustrated on "x-axis" 20. It should be understood that reference line 24 represents the direction of current flow as the stored charge is removed from image sensing region 14.

To further facilitate an understanding of diagram 23, brackets have been added to show the positions of regions 17, 18, 19, and 22, as well as transfer gate 12. Thus, primary region 17 is identified by the bracket labeled with the number 17'; neck region 18 is identified by the bracket labeled with the number 18'; gate region 19 is identified by the bracket labeled 19'; transfer gate 12 is identified by the bracket labeled 12'; and source node 22 is identified by the bracket labeled 22'.

Electrostatic diagram 23 also has a "y-axis" 29 that represents pinning potentials in volts (V) at each point along reference line 24. The pinning potential is the voltage required to remove all stored electrons from a particular location in image sensing region 14. The pinning potentials of image sensing region 14 along reference line 24 are illustrated in FIG. 2 by potential line 33. Said another way, potential line 33 represents a potential well diagram for image sensing device 11 when device 11 is sensing an optical image or operating in an image sensing mode. As charge is collected and stored in image sensing device 11, it flows to a location with the highest pinning potential. The amount of charge stored in image sensing region 14, i.e., primary region 17, neck region 18, and gate region 19, is represented by cross-hatching 34. It should be noted that because transfer gate 12 has not been activated, an electrostatic barrier is present between gate region 19 and source region 22. Thus, the amount of charge in source region 22 is negligible and, therefore, cross-hatchings are absent from the portion of electrostatic diagram 23 representing source region 22. The height of the electrostatic barrier is indicated by arrows 30.

Now referring to FIG. 3, an electrostatic diagram 38 is illustrated that shows the amount of charge stored in image sensing region 14 when a potential is applied to source region 22 and transfer gate 12 is enabled, i.e., on or activated. The charge stored in neck region 18 and gate region 19 has been transferred to source region 22 as illustrated by the absence of cross-hatching from neck region 18 and gate region 19 and the presence of cross-hatching 39 in source region 22. However, some of the charge remains in primary region 17.

Thus, not all of the charge stored in image sensing area 11 is transferred to source region 22 when a voltage is applied to source region 22 and transfer gate 12 is enabled. This is because the physical narrowing of image sensing region 14 at neck region 18 creates the electrostatic barrier (illustrated by arrows 30' in FIG. 3) that prevents some of the charge in primary region 17 from being transported to source region 22. The height of the electrostatic barrier is inversely proportional to the effective width of neck region 18. In other words, as the width of neck region 18 is reduced, the height of the barrier is increased and the amount of stored charge that remains in image sensing area 14 is increased.

It should be noted that the width of the electrostatic barrier is proportional to the length of neck region 18 along reference line 24. In general, the width of the electrostatic barrier illustrated in electrostatic diagram 38 (FIG. 3) is not nearly as significant as the height of the barrier. If the length of neck region 18 is sufficiently short, charge stored in image sensing region 14 may be able to overcome the electrostatic barrier created by neck region 18. This is possible if the width of the electrostatic barrier is sufficiently narrow that it is possible for the stored charge to tunnel through the electrostatic barrier. In prior art image sensing devices, the width of the electrostatic barrier is sufficiently large that the stored charge cannot tunnel through the electrostatic barrier.

FIG. 4 is a top view of a portion 40 of a pixel cell in accordance with a first embodiment of the present invention. What is shown in FIG. 4 is a top view of an image sensing device 41, a transfer gate 42, and a source node 43. Source node 43 is also referred to as a floating diffusion node or region. The source node is typically located between transfer gate 42 and a reset gate (not shown). Image sensing device 41 is formed in a semiconductor substrate and has an active sensing area or region 47 surrounded by a field oxide 48. Image sensing region 47 is comprised of rectangularly shaped regions separated by tapered regions. More particularly, a rectangularly shaped region 49 having a device width $W_{49}$ is adjacent transfer gate 42. Device width $W_{49}$ is substantially constant in rectangularly shaped region 49. A tapered region 50 couples a rectangularly shaped region 51 to rectangularly shaped region 49. Tapered region 50 has a variable device width $W_{50}$ that is wider adjacent rectangularly shaped region 49 and narrower adjacent rectangularly shaped region 51, i.e., tapered region 50 tapers or narrows in a direction extending away from rectangularly shaped region 49. Rectangularly shaped region 51 has a device width $W_{51}$ that is substantially constant.

Rectangularly shaped region 51 is coupled to a rectangularly shaped region 53 by a tapered region 52. Tapered region 52 has a variable device width $W_{52}$ that is wider adjacent rectangularly shaped region 50 and narrower adjacent rectangularly shaped region 53. Rectangularly shaped region 53 has a device width $W_{53}$ that is substantially constant. It should be understood that the width of a sub-region is the minimum distance between any two opposing sides of the sub-region.

Rectangularly shaped regions 49, 51, and 53 have substantially uniform widths $W_{49}$, $W_{51}$, and $W_{53}$, respectively, wherein the width of rectangularly shaped region 53 is less than that of rectangularly shaped region 51, which in turn is less than that of rectangularly shaped region 49, i.e., $W_{53} < W_{51} < W_{49}$. It should be understood that in accordance with the first embodiment, the device width of a region is the narrowest width of the region in a direction in which current flows. Thus, the device width of rectangularly shaped regions 49 and 51 is the length of rectangular shape of these regions. Tapered region 47 has a width $W_{47}$ that ranges between the width of rectangularly shaped region 51 and the width of rectangularly shaped region 49, i.e., $W_{51} \leq W_{50} \leq W_{49}$. Tapered region 52 has a width $W_{52}$ that ranges between the width of rectangularly shaped region 49 and the width of rectangularly shaped region 51, i.e., $W_{53} \leq W_{52} \leq W_{51}$.

Thus, the width of image sensing area 47 is widest in the rectangularly shaped region proximal to transfer gate 42 and decreases in a direction towards rectangularly shaped region 53, i.e., the rectangularly shaped region distal from transfer gate 42.

A reference line 54 merely illustrates a path traversed between points 56 and 57 and will be further described with reference to FIG. 7.

Figure 5:
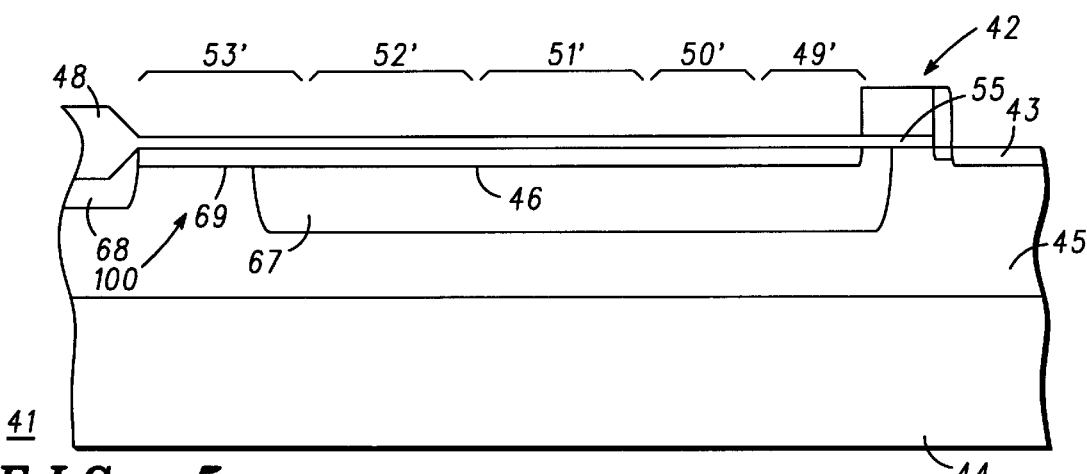
FIG. 5 is a cross-sectional view of image sensing device 41 along section line 5–5 of FIG. 4.

FIG. 5 is a cross-sectional view of image sensing device 41 along section line 5—5 of FIG. 4. What is shown in FIG. 5 is a semiconductor material comprising a semiconductor substrate 44 having an epitaxial layer 45 disposed thereon. By way of example, semiconductor substrate 44 and epitaxial layer 45 are of P-type conductivity, wherein the concentration of the P-type dopant in semiconductor substrate 44 is greater than the concentration of the P-type dopant in epitaxial layer 45. The semiconductor material has a major surface 46 having a gate oxide layer 55 disposed thereon. Transfer gate 42 is formed on a portion of gate oxide layer 55. In addition, a portion of field oxide 48 is formed on epitaxial layer 45.

A field region 68 is formed under field oxide 48. A photodiode well 67 of N type conductivity extends from major surface 46 into epitaxial layer 45. When image sensing device 41 is a pinned photodiode, a pinning region 69 is formed in epitaxial layer 45. By way of example, pinning region 69 is of P-type conductivity and extends from field implant region 68 to an edge of transfer gate 42. Pinning region 69 does not extend as far into epitaxial layer 45 as photodiode well 67. Image sensing device 41 further includes a source region 43 of N-type conductivity. Typically, at a user defined point along an edge of image sensing region 47, a region 100 will be provided such that photodiode well 67 does not extend all the way to field region 68 to facilitate electrical connection between epitaxial layer 45 and pinning region 69. The location of this region may vary depending on the layout configuration of image sensing device 41.

Although not shown, it should be understood that a salicide blocking structure may be formed on image sensing device 41. Typically, a salicide blocking structure is a nitride mask that prevents the formation of salicide on image sensing device 41. Because this structure is an optional feature, it has not been shown.

To further facilitate an understanding of the relationship between the portions of image sensing device 41 of FIGS. 4 and 5, brackets have been added to show the positions of regions 49, 50, 51, 52, and 53. Thus, rectangularly shaped regions 49, 51, and 53 are identified by the brackets labeled with the numbers 49', 51', and 53', respectively; and tapered regions 50 and 52 are identified by the brackets labeled with the numbers 50' and 52'.

Figure 6:
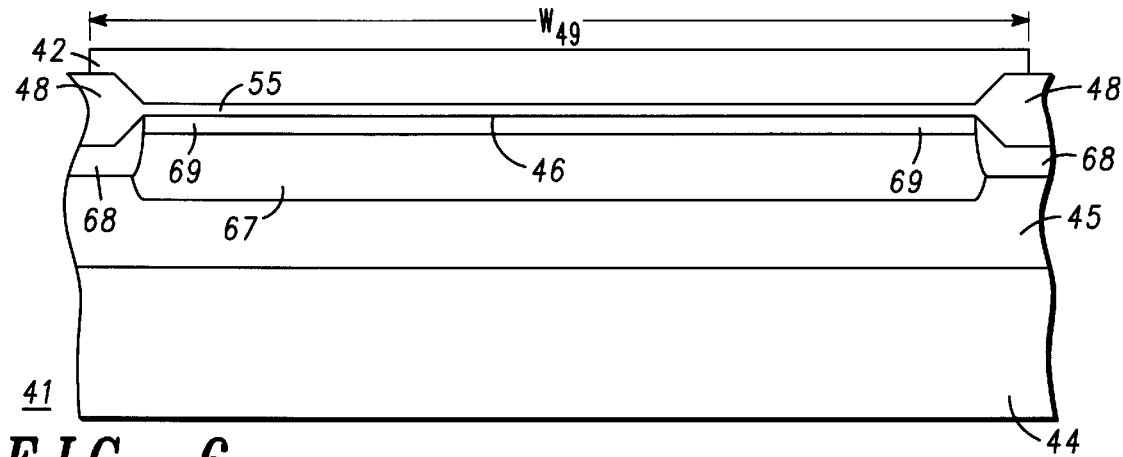
FIG. 6 is a cross-sectional view of image sensing device 41 along section 6–6 of FIG. 4.

FIG. 6 is a cross-sectional view of image sensing device 41 along section 6—6 of FIG. 4. It should be understood that the same reference numerals in different figures denote the same elements. In particular, semiconductor substrate 44, epitaxial layer 45, photodiode well 67, pinning region 69, oxide layer 55, field implant region 68, field oxide 48, and transfer gate 42 have been described with reference to 0FIGS. 4 and 5. FIG. 6 further illustrates the width $W_{49}$ of the image sensing region adjacent transfer gate 42. Width $W_{49}$ is larger than widths $W_{50}$, $W_{51}$, $W_{52}$, and $W_{53}$. Thus, cross-sections taken in regions 50, 51, 52, and 53 will look similar to that shown in FIG. 6, except that the widths will be progressively smaller.

Figure 7:
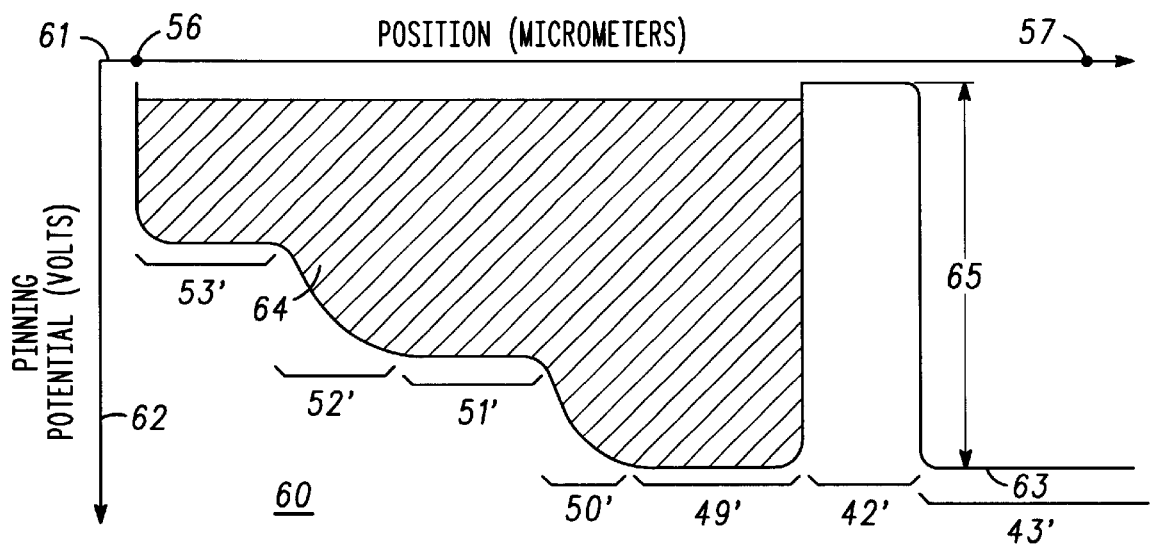
FIG. 7 is an electrostatic diagram for the pixel cell of FIG. 4 when the transfer gate is not enabled.

The effect of configuring image sensing region 47 to be wider near transfer gate 42 and narrower when moving towards reference point 56 is demonstrated in electrostatic diagram 60 shown in FIG. 7, which is described in conjunction with FIG. 4. Electrostatic diagram 60 is a graph that indicates the amount of charge stored in image sensing region 47 when a potential is not applied to source region 43 and transfer gate 42 is not enabled, i.e., off. Electrostatic diagram 60 has an "x-axis" 61 that represents a position in micrometers across image sensing region 47, transfer gate 42, and source node 43 (see FIG. 4) along reference line 54. Reference line 54 is included to aid in the description of electrostatic diagram 60. Reference line 54 corresponds to positions along the "x-axis" beginning at a point 56 away from transfer gate 42. Reference line 54 then traverses image sensing region 47 and transfer gate 42, and terminates at a point 57 near source node 43. Reference points 56 and 57 are illustrated on "x-axis" 61. Reference line 54 represents the direction of current flow as the stored charge is removed from image sensing region 47.

To facilitate an understanding of diagram 60, brackets have been added to show the positions of regions 49, 50, 51, 52, and 53 as well as transfer gate 42. Thus, rectangularly shaped regions 49, 51, and 53 are identified by the brackets labeled with the numbers 49', 51', and 53', respectively; tapered regions 50 and 52 are identified by the brackets labeled with the numbers 50' and 52'; transfer gate 42 is identified by the bracket labeled 42'; and source node 43 is identified by the bracket labeled 43'.

Electrostatic diagram 60 also has a "y-axis" 62 that represents pinning potentials in volts (V) at each point along reference line 54. The pinning potentials of image sensing region 47 along reference line 54 are illustrated in FIG. 7 by potential line 63. Said another way, potential line 63 represents a potential well diagram for image sensing device 41 when device 41 is sensing an optical image or operating in an image sensing mode. As charge is stored in image sensing device 41, it flows to a location with the highest pinning potential. The amount of charge stored in image sensing region 47, i.e., rectangularly shaped regions 49, 51, and 53 and tapered regions 50 and 52 is represented by cross-hatching 64. It should be noted that because transfer gate 42 has not been activated, an electrostatic barrier is present between rectangularly shaped region 49 and source region 43. Thus, the amount of charge in source region 43 is negligible and, therefore, cross-hatchings are absent from the portion of electrostatic diagram 63 representing source region 43. The height of the electrostatic barrier is indicated by arrows 65.

Figure 8:
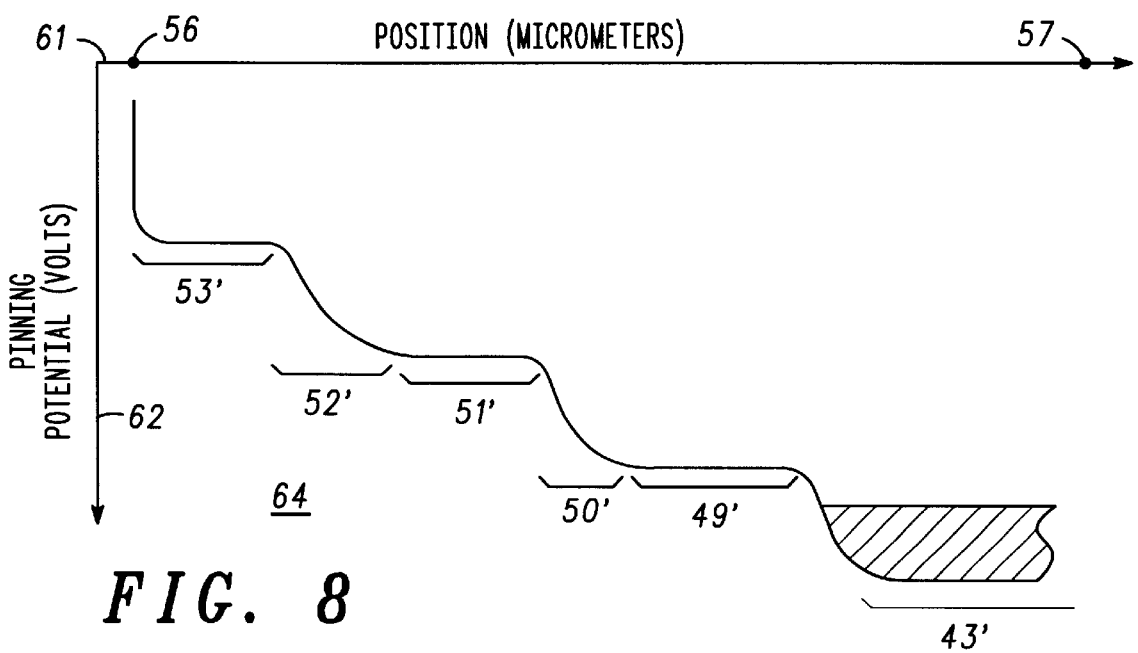
FIG. 8 is an electrostatic diagram for the pixel cell of FIG. 4 when the transfer gate is enabled.

Now referring to FIG. 8, an electrostatic diagram 64 is illustrated that shows the amount of charge stored in image sensing region 41 when a potential is applied to source region 43 and transfer gate 42 is enabled. The charge stored in rectangularly shaped regions 49, 51, and 53, and tapered regions 50 and 52 has been transferred to source region 43 as illustrated by the absence of cross-hatching from regions 49, 50, 51, 52, and 53 and the presence of cross-hatching 66 in source region 43.

Thus, substantially all of the charge in image sensing device 41 is transferred to source region 43 when using the configuration of image sensing region 47 in accordance with the first embodiment of the present invention. The height of the electrostatic barrier (reference numeral 65 in FIG. 7) has been altered such that substantially all of the charge in image sensing region 47 is transferred to source region 43. The height of the electrostatic barrier is proportional to the effective width of rectangularly shaped region 49. Because the width of rectangularly shaped region 49 is the widest of rectangularly shaped regions 49, 51, and 53 and tapered regions 50 and 52 of image sensing region 47, the height of the barrier is greatest at this region.

Figure 9:
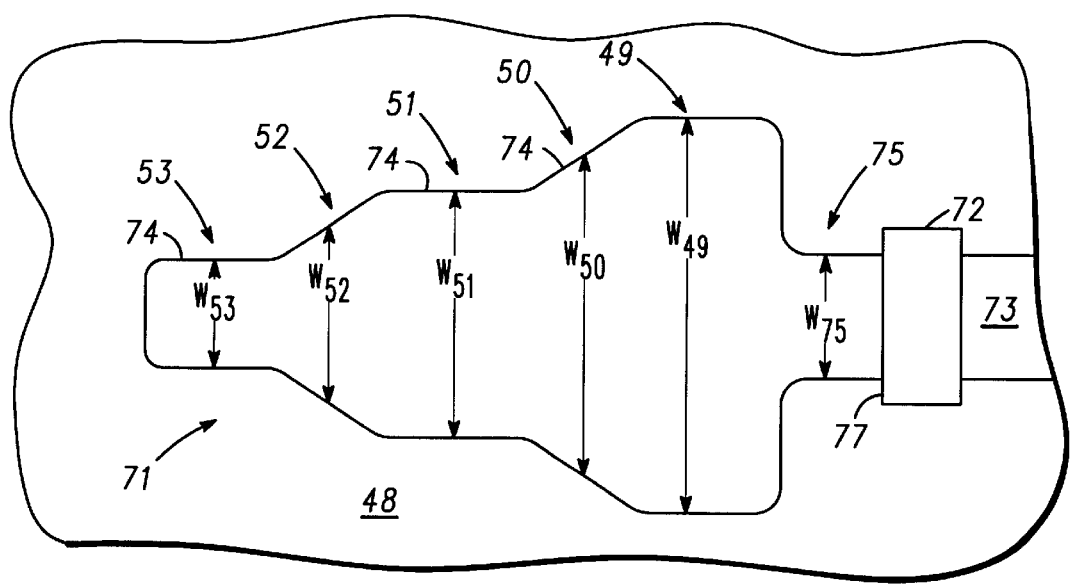
FIG. 9 is a top view of a portion of a pixel cell in accordance with a second embodiment of the present invention.

FIG. 9 is a top view of a portion 70 of a pixel cell in accordance with a second embodiment of the present invention. More particularly, FIG. 9 illustrates a top view of an image sensing device 71, a transfer gate 72, and a source node 73. Image sensing device 71 is formed in a semiconductor substrate and has an active sensing area or region 74. Image sensing region 74 is surrounded by a field oxide 48 and is comprised of rectangularly shaped regions 49, 51, and 53 and tapered regions 50 and 52 as described with reference to FIG. 4. In addition, image sensing region 74 includes a neck region 75 having a width $W_{75}$ that is less than width $W_{49}$ of rectangularly shaped region 49. Neck region 75 has a length $L_{75}$ that extends from an edge 77 of transfer gate 72 to an edge of rectangularly shaped region 49 that is proximal to edge 77, wherein length $L_{75}$ has a value of 0.3 micrometers or less. It should be noted that edges are also referred to as sides. Although, width $W_{75}$ is less than width $W_{49}$, the short length of neck region 75 allows the potential applied to transfer gate 72 to lower the electrostatic barrier created by neck region 75. Thus, in the second embodiment, length $L_{75}$ is maintained at a value of 0.3 micrometers or less. Under this condition, the electrostatic diagrams for image sensing device 71 are the same as those shown in FIGS. 7 and 8 for image sensing device 41.

Figure 10:
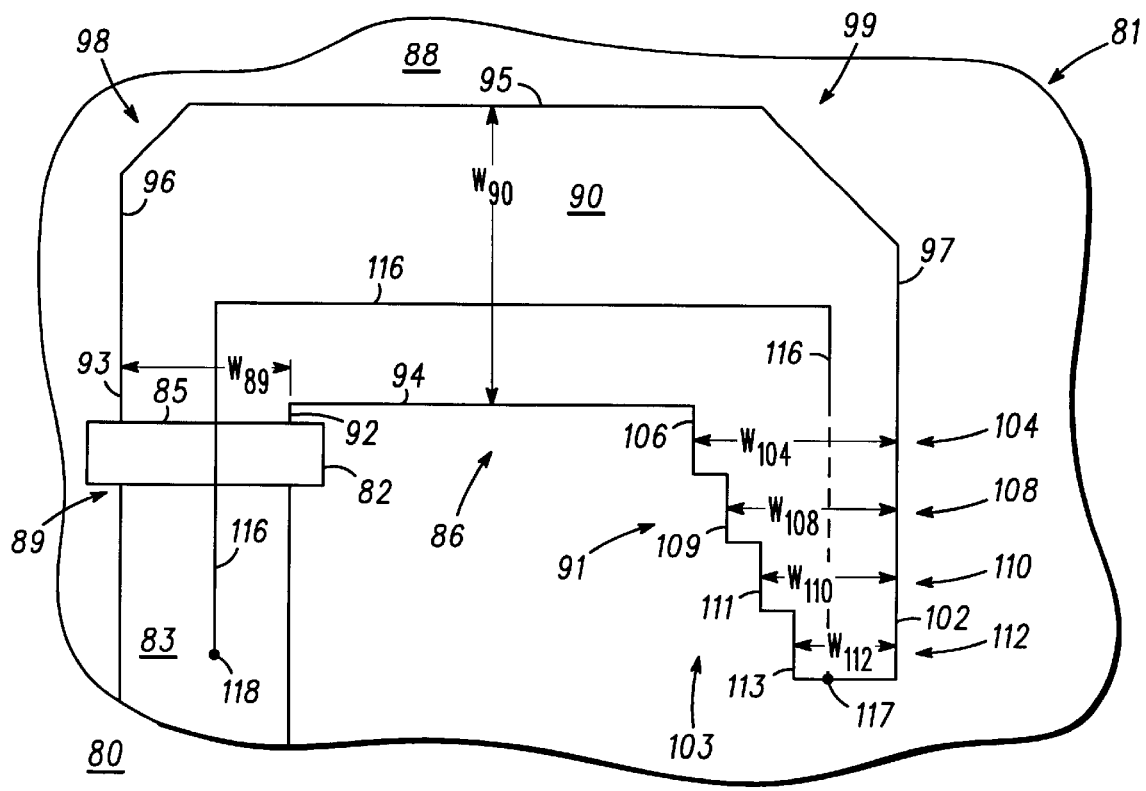
FIG. 10 is a top view of a portion of a pixel cell in accordance with a third embodiment of the present invention.

FIG. 10 is a top view of a portion 80 of a pixel cell in accordance with a third embodiment of the present invention. More particularly, FIG. 10 illustrates a top view of an image sensing device 81, a transfer gate 82, and a source node 83. Image sensing device 81 is formed in a semiconductor substrate and has an active sensing area or region 86. Active sensing region 86 is surrounded by a field oxide 88 and is comprised of a neck region 89, a primary region 90, and stepped region 91. Neck region 89 is a rectangularly shaped region adjacent an edge 85 of transfer gate 82. Neck region 89 has two opposing edges 92 and 93 extending from edge 85 of transfer gate 82. Edges are also referred to as sides. The length of edges 92 and 93 is less than approximately 0.3 micrometers. Although this embodiment includes neck region 89, it should be understood this is not a limitation of the present invention. For example, a neck region may be absent from image sensing device 81 or edge 85 of transfer gate 82 can overlap edge 94 of image sensing area 86.

Primary region 90 is a rectangularly-shaped region having opposing edges 94 and 95 and opposing edges 96 and 97. Although corners 98 and 99 of primary region 90 are shown as being beveled or tapered, this is not a limitation of the present invention. As illustrated in the first embodiment, beveling may be used as needed to maintain the desired potential profile. Edges 94 and 95 are substantially parallel to one another and are spaced apart from one another by a device width $W_{90}$. It should be understood that image sensing region 86 is a continuous structure. Thus, the portion of neck region 89 between edges 92 and 93 adjacent primary region 90 is continuous with primary region 90.

Image sensing region 86 further includes a stepped or serrated region 91. Stepped region 91 has a substantially linear or straight edge 102 and a serrated edge 103. Because of serrated edge 103, stepped region can be described as comprising a plurality of adjacent rectangular regions, wherein edge 102 is common to each adjacent rectangular region and each adjacent rectangular region has a substantially uniform device width that is different from the device width of an adjacent rectangular region. More particularly, stepped region 91 is comprised of a rectangular region 104 having opposing edges 102 and 106 and a device width $W_{104}$; a rectangular region 108 having opposing edges 102 and 109 and a device width $W_{108}$; a rectangular region 110 having opposing edges 102 and 111 and a device width $W_{110}$; and a rectangular region 112 having opposing edges 102 and 113 and a device width $W_{112}$. Edges 106, 109, 111, and 113 cooperate to form edge 103. Device width $W_{104}$ is greater than device width $W_{108}$, device width $W_{108}$ is greater than device width $W_{110}$, and device width $W_{110}$ is greater than device width $W_{112}$, i.e., $W_{104} > W_{108} > W_{110} > W_{112}$. Image sensing region 86 is a continuous structure. Thus, the portion of serrated region 104 between edges 102 and 106 adjacent primary region 90 is continuous with primary region 90. Likewise, the portion of serrated region 108 between edges 102 and 109 is continuous with serrated region 104; the portion of serrated region 110 between edges 102 and 111 is continuous with serrated region 108; and the portion of serrated region 112 between edges 102 and 113 is continuous with serrated region 110. Although four rectangular regions have been shown and described, it should be understood this is not a limitation of the present invention. For example, there can be more or less than four rectangular regions.

Thus, the width of image sensing area 86 is widest in primary region 90, i.e., the region proximal to transfer gate 82 and decreases in a direction towards stepped region 91, i.e., away from transfer gate 82.

A reference line 116 merely illustrates a path traversed between points 117 and 118 and will be further described with reference to FIGS. 11 and 12.

Figure 11:
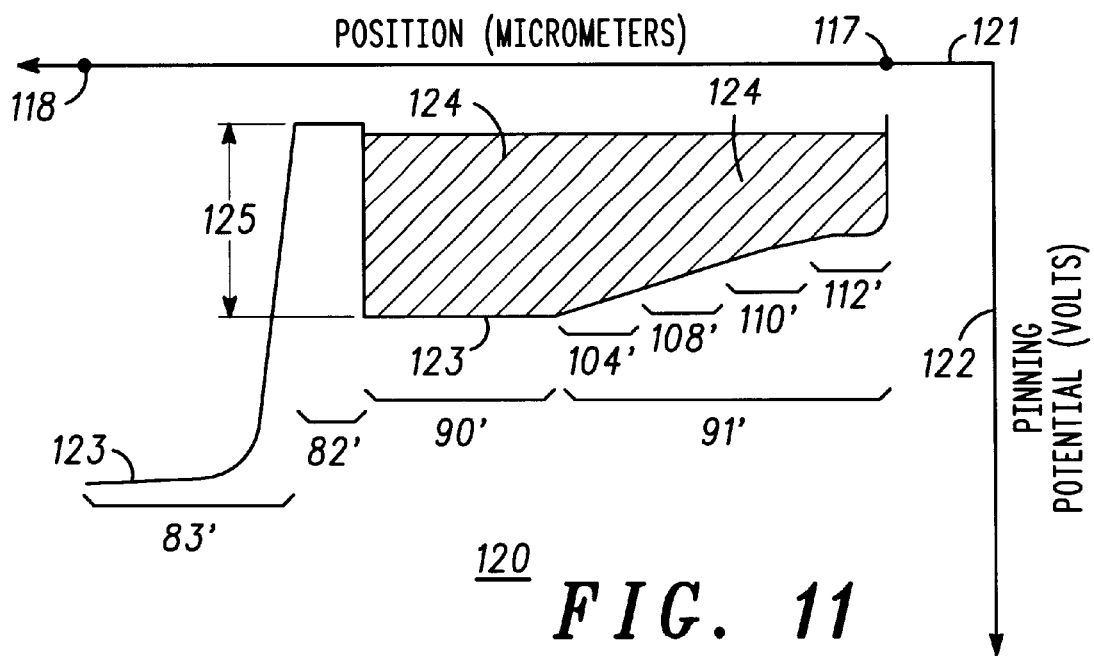
FIG. 11 is an electrostatic diagram for a pixel cell in accordance with the present invention when the transfer gate is not enabled.

The effect of configuring image sensor region 86 to be wider near transfer gate 82 and narrower when moving towards reference point 117 is demonstrated in electrostatic diagram 120 shown in FIG. 11, which is described in conjunction with FIG. 10. Electrostatic diagram 120 is a graph that indicates the amount of charge stored in image sensing region 86 when a potential is not applied to source region 83 and transfer gate 82 is not enabled, i.e., off. Electrostatic diagram 120 has an "x-axis" 121 that represents a position in micrometers across image sensing region 86, transfer gate 82, and source node 83 (see FIG. 10). To aid in the description, reference line 116 (shown in FIG. 10) corresponds to positions along the "x-axis" and begins at the furthest point 117 from transfer gate 82, traverses image sensing region 86 and transfer gate 82, and terminates at a point 118 beyond source node 83. Reference points 117 and 118 are illustrated on "x-axis" 121. Reference line 116 represents the direction of current flow as the stored charge is removed from image sensing region 86.

To facilitate an understanding of diagram 120, brackets have been added to show the positions of stepped region 91, (i.e., region 112, 110, 108, 104), primary region 90, neck region 89, transfer gate 82, and source region 83. Thus, regions 91, 90, and 89 are identified by the brackets labeled with the numbers 91', 90', and 89', respectively; rectangular regions 112, 110, 108, and 102 of region 91 are identified by the brackets labeled with the numbers 112', 110', 108', and 104'; transfer gate 82 is identified by the bracket labeled 82'; and source node 83 is identified by the bracket labeled 83'.

Electrostatic diagram 120 also has a "y-axis" 122 that represents pinning potentials in volts (V) at each point along reference line 116. The pinning potentials of image sensing region 86 along reference line 116 are illustrated in FIG. 11 by potential line 123. Said another way, potential line 123 represents a potential well diagram for image sensing device 81 when device 81 is sensing an optical image or operating in an image sensing mode. As charge is stored in image sensing device 81, it flows to a location with the highest pinning potential. The amount of charge stored in image sensing region 86, i.e., regions 89, 90, and 91 is represented by cross-hatching 124. It should be noted that because transfer gate 82 has not been activated, an electrostatic barrier is present between image sensing region 90 and source region 83. Thus, the amount of charge in source region 83 is negligible and, therefore, cross-hatching is absent from the portion of electrostatic diagram 123 representing source region 83. The height of the electrostatic barrier is indicated by arrows 125.

Figure 12:
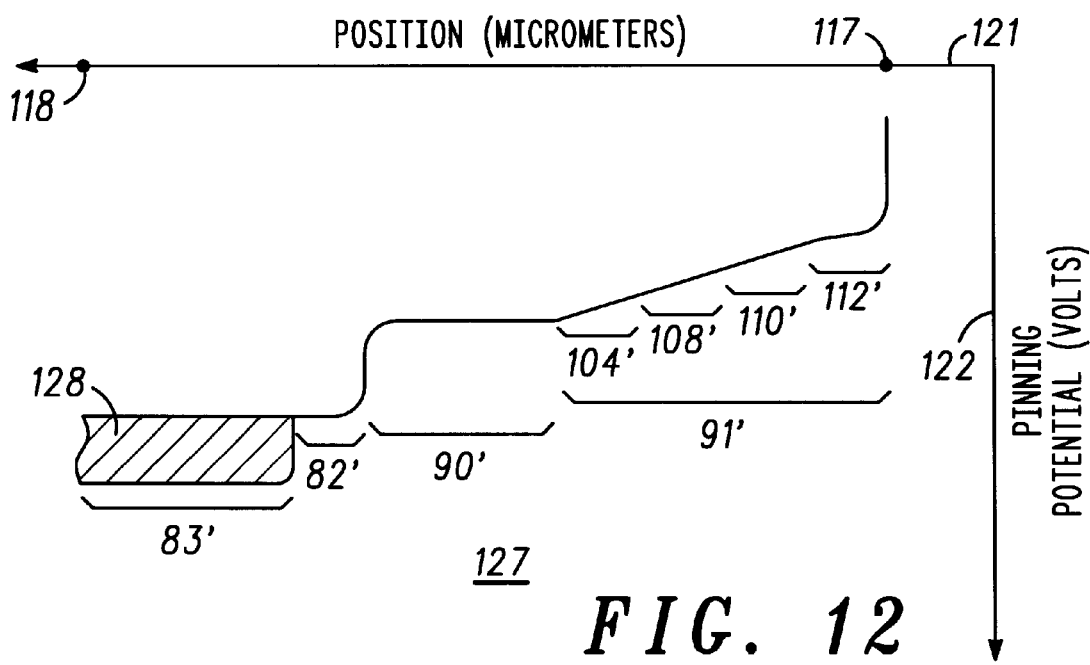
FIG. 12 is an electrostatic diagram for a pixel cell in accordance with the present invention when the transfer gate is enabled.

Now referring to FIG. 12, an electrostatic diagram 127 is illustrated that shows the amount of charge stored in image sensing region 81 when a potential is applied to source region 83 and transfer gate 82 is enabled. The charge stored in regions 89, 90, and 91 has been transferred to source region 83 as illustrated by the absence of cross-hatching from regions 89, 90, and 91 and the presence of cross-hatchings 128 in source region 83.

Thus, substantially all of the charge in image sensing device 81 is transferred to source region 83 when using the configuration of image sensing region 86 in accordance with this embodiment of the present invention. The height of the electrostatic barrier (reference numeral 125 in FIG. 11) has been altered such that substantially all of the charge in image sensing region 86 is transferred to source region 83. The height of the electrostatic barrier is proportional to the effective device width of primary region 90. Because the device width of primary region 90 is the widest of regions 90 and 91, the height of the barrier is greatest in this region.

Figure 13:
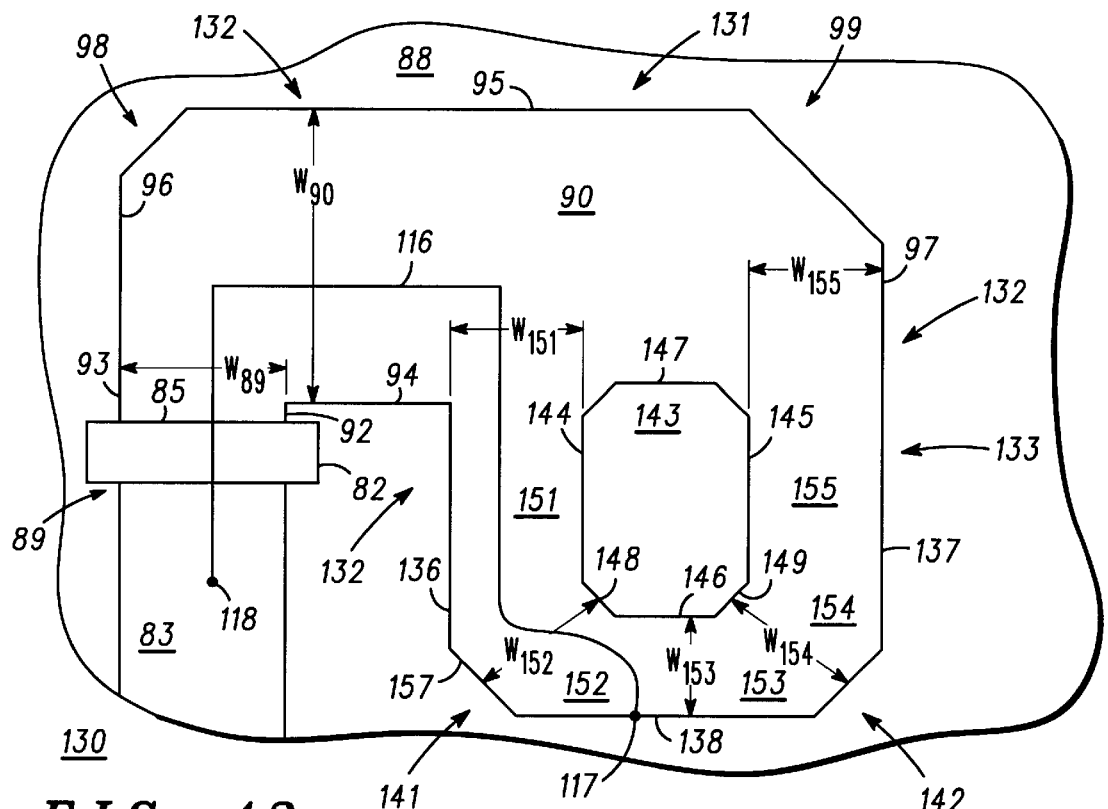
FIG. 13 is a top view of a portion of a pixel cell in accordance with a fourth embodiment of the present invention.

FIG. 13 is a top view of a portion 130 of a pixel cell in accordance with a fourth embodiment of the present invention. More particularly, FIG. 13 illustrates a top view of an image sensing device 131, a transfer gate 82, and a source node 83. Image sensing device 131 is formed in a semiconductor substrate and has an active sensing area or region 132. Image sensing region 132 is surrounded by a field oxide 88 and is comprised of a neck region 89, a primary region 90, and an extended primary region 133. It should be understood that the same reference numerals in different figures denote the same elements. In particular, neck region 89 and primary region 90 have been described with reference to FIG. 10.

Extended primary region 133 is a rectangularly-shaped region having opposing edges 136 and 137 and an edge 138. Although corners 141 and 142 of extended primary region 133 are shown as being beveled or tapered, this is not a limitation of the present invention. As illustrated in the first embodiment, beveling may be used as needed to maintain the desired potential profile. An island 143 of field oxide having opposing edges 144 and 145 and opposing edges 146 and 147 is positioned in extended primary region 133. Although field oxide island 143 is shown as extending into primary region 90, it should be understood this is not a limitation of the present invention. For example, field oxide island 143 may be present only in extended primary region 133. Field oxide island 143 serves to shorten the device widths within extended primary region 133 so that they are less than device width $W_{90}$. In accordance with the fourth embodiment, extended primary region has five sub-regions 151, 152, 153, 154, and 155, wherein each sub-region 151, 152, 153, 164, and 155 has its own device width. More particularly, sub-region 151 has a device width $W_{151}$ that extends from edge 136 to edge 144; sub-region 152 has a device width $W_{152}$ that extends from edge 148 to edge 157; sub-region 153 has a device width $W_{153}$ that extends from edge 138 to edge 146; sub-region 154 has a device width $W_{154}$ that extends from edge 149 to edge 158; sub-region 155 has a device width $W_{155}$ that extends from edge 137 to edge 145. It should be understood that a device width of a region is the shortest distance between two opposing edges of that region. It should be further understood that device widths $W_{89}$, $W_{90}$, $W_{151}$, $W_{152}$, $W_{153}$, $W_{154}$, and $W_{155}$ may be equal or they may be set such that device width $W_{153}$ is less than or equal to device widths $W_{152}$ and $W_{154}$, which in turn are less than or equal to device widths $W_{151}$ and $W_{152}$, which in turn are less than or equal to device widths $W_{89}$ and $W_{90}$, i.e., $W_{153} \leq W_{152}$, $W_{154} \leq W_{151}$, $W_{155} \leq W_{89}$, $W_{90}$. Thus, the width of image sensing area 132 is widest in the portions of image sensing region 133 proximal to transfer gate 82 and decreases in a direction towards and around island, i.e., away from transfer gate 82.

Image sensing region 132 is a continuous structure. Thus, sub-regions 151, 152, 153, 154, and 155 are continuous with each other and continuous with primary region 90. In other words, neck region 89, primary region 90, and extended primary region 132 form a continuous structure. Although a single field oxide island is shown, this is not a limitation of the present invention, i.e., there may be one or more field oxide islands formed in primary region 90 and extended primary region 132. Furthermore, the shape of field oxide island 143 is not a limitation of the present invention. For example, the field oxide island can have three sides, four sides, five sides, seven sides, etc.

Image sensing device 131 has a electrostatic diagram similar to electrostatic diagrams 120 and 127 shown in FIGS. 11 and 12, respectively.

Figure 14:
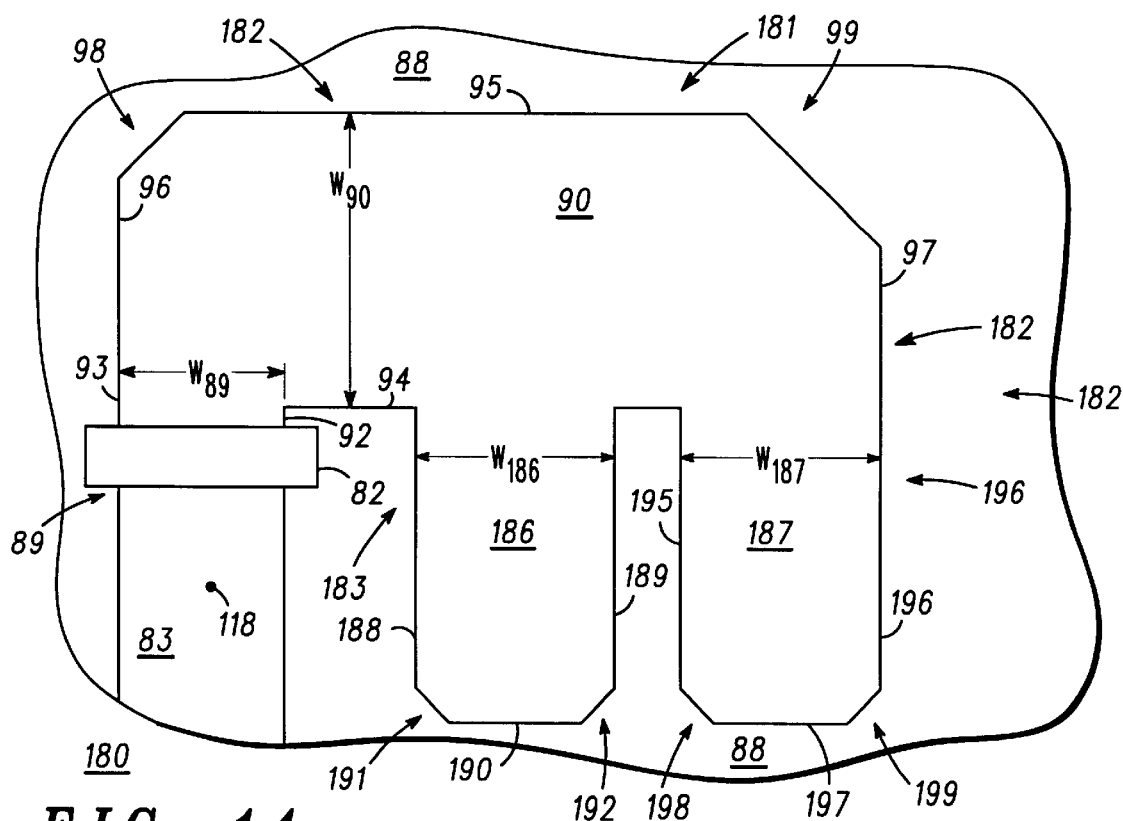
FIG. 14 is a top view of a portion of a pixel cell in accordance with a fifth embodiment of the present invention.

FIG. 14 is a top view of a portion 180 of a pixel cell in accordance with a fifth embodiment of the present invention.

More particularly, FIG. 14 illustrates a top view of an image sensing device 181, a transfer gate 82, and a source node 83. Image sensing device 131 is formed in a semiconductor substrate and has an active sensing area or region 182. Image sensing region 182 is surrounded by a field oxide 88 and is comprised of a neck region 89, a primary region 90, and an extended primary region 183. It should be understood that the same reference numerals in different figures denote the same elements. In particular, neck region 89 and primary region 90 have been described with reference to FIG. 10.

Extended primary region 183 is comprised of two rectangularly-shaped extensions 186 and 187. Extensions 186 and 187 are also referred to as fingers or tabs. Extension 186 has two opposing edges 188 and 189, an end edge 190, and tapered corners 191 and 192. Extension 186 has a device width $W_{186}$ that extends from edge 188 to 189. Extension 187 has two opposing edges 195 and 196, an end edge 197, and tapered corners 198 and 199. Extension 187 has a device width $W_{187}$ that extends from edge 195 to 197. Device widths $W_{186}$ and $W_{187}$ are preferably equal. Device widths $W_{186}$ and $W_{187}$ are less than or equal to device widths $W_{89}$ and $W_{90}$. Thus, the width of image sensing area 182 is widest in the portions of image sensing region 183 proximal to transfer gate 82 and decreases in a direction towards extensions 186 and 187, i.e., away from transfer gate 82.

Image sensing region 182 is a continuous structure. Thus, extensions 186 and 187 are continuous with primary region 90. In other words, neck region 89, primary region 90, and extended primary region 132 form a continuous structure. The number of extensions is not a limitation of the present invention, i.e., there may be more than two field extensions.

Image sensing device 181 has a electrostatic diagram similar to electrostatic diagrams 120 and 127 shown in FIGS. 11 and 12, respectively.

Figure 15:
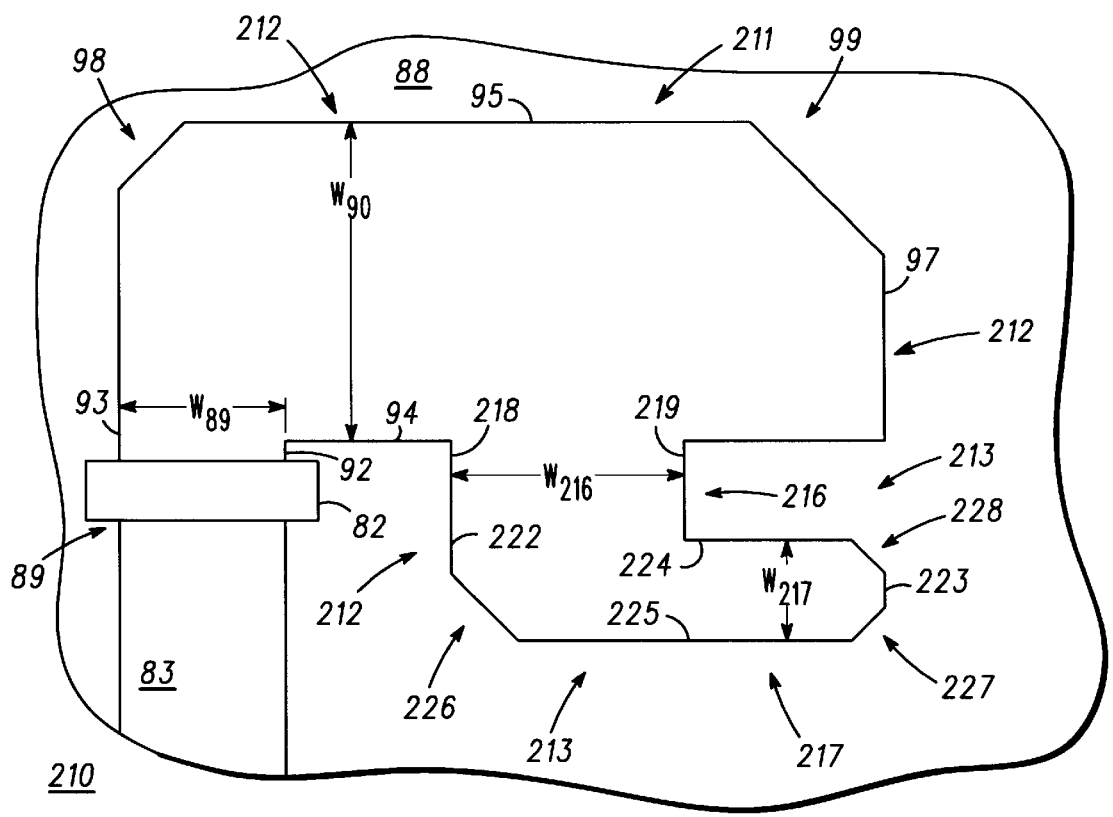
FIG. 15 is a top view of a portion of a pixel cell in accordance with a sixth embodiment of the present invention.

FIG. 15 is a top view of a portion 210 of a pixel cell in accordance with a sixth embodiment of the present invention. More particularly, FIG. 15 illustrates a top view of an image sensing device 211, a transfer gate 82, and a source node 83. Image sensing device 211 is formed in a semiconductor substrate and has an active sensing area or region 212. Image sensing region 212 is surrounded by a field oxide 88 and is comprised of a neck region 89, a primary region 90, and an extended primary region 213. It should be understood that the same reference numerals in different figures denote the same elements. In particular, neck region 89 and primary region 90 have been described with reference to FIG. 10.

Extended primary region 213 is comprised of two rectangularly-shaped regions 216 and 217. Extended primary region 213 is also referred to as a tab. Rectangularly shape region 216 has two opposing edges 218 and 219 and a device width $W_{216}$ that extends from edge 218 to 219. Rectangularly shaped region 217 has opposing edges 222 and 223, opposing edges 224 and 225, and tapered corners 226, 227, and 228. Further, rectangularly shaped region 217 has a device width $W_{217}$, wherein device width $W_{217}$ is less than device width $W_{216}$ which in turn is less than device widths $W_{89}$ and $W_{90}$. Image sensing region 212 is a continuous structure. Thus, primary region 90 is continuous with rectangularly shaped region 216, which is continuous with rectangularly shaped region 217.

The width of image sensing area 212 is widest in primary region 90, i.e., the region proximal to transfer gate 82 and decreases in a direction towards field extension region 213, i.e., away from transfer gate 82.

Image sensing device 211 has a electrostatic diagram similar to electrostatic diagrams 120 and 127 shown in FIGS. 11 and 12, respectively.

By now it should be appreciated that an electronic component having an image sensing device and a method for improving charge transfer efficiency from the image sensing device have been provided. The present invention takes advantage of the narrow width effect of the image sensing device by forming the image sensing area to have a widest device width near the transfer gate. This structure ensures that the electrostatic barrier between the image sensing region and the source region is reduced when the transfer gate is enabled such that substantially all of the charge within the image sensing area is transferred to the source region. Removing all the charge from this region increases the accuracy of the photodiode, lowers its power consumption and eliminates sensor lag, which can cause ghost images to appear in video applications. In addition, the present invention can be readily incorporated into standard processing flows. Thus, the present invention does not increase the manufacturing cost and the cycle time for manufacturing pixel cells.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An electronic component having a photosensor, the photosensor comprising:
   a semiconductor material having a surface;
   a transfer gate overlying a portion of the semiconductor material of a first conductivity type having a first edge and a second edge; and
   a first doped region of a second conductivity type comprising a first portion having a first width, a second portion having second width, and a third portion having a third width, wherein the first portion is adjacent to the transfer gate, and the second portion is between the first and third portions, wherein each electron path that passes through the first, second, and third portions terminates at the first edge, and wherein the second width is greater than the first width and the third width.

2. The electronic component of claim 1, wherein the first doped region further comprises a fourth portion having a fourth width, wherein the fourth portion is adjacent to the third portion, and wherein the fourth width is smaller than the third width.

3. The electronic component of claim, 2 wherein the first doped region further comprises a fifth portion having a fifth width, wherein the fifth portion is adjacent to the third portion, and wherein the fifth width is smaller than the third width.

4. An electronic component having a photosensor, the photosensor comprising:
   a semiconductor material of a first conductivity type having a surface;
   a transfer gate overlying a portion of-the semiconductor material having a first edge and a second edge; and
   a first doped region of a second conductivity type adjacent to the first edge;
   a second doped region of the second conductivity type adjacent to the second edge having a channel width; and
   a third doped region of the second conductivity type adjacent to the second doped region having a first electron path therethrough to the second doped region and having a first maximum width greater than the channel width;.

a fourth doped region of the second conductivity type adjacent to the third doped region having a second electron path therethrough coupled to the first electron path and a second maximum-width less than the first maximum width; and a fifth doped region of the second conductivity type adjacent to the third doped region having a third electron path therethrough coupled to the first electron path and a third maximum width less than the first maximum width.

* * * * *